(12) United States Patent
Zhu

(10) Patent No.: US 11,038,057 B2
(45) Date of Patent: Jun. 15, 2021

(54) SEMICONDUCTOR DEVICE WITH HIGH-QUALITY EPITAXIAL LAYER AND METHOD OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 75 days.

(21) Appl. No.: 15/781,988

(22) PCT Filed: Jun. 27, 2016

(86) PCT No.: PCT/CN2016/087244
§ 371 (c)(1),
(2) Date: Nov. 6, 2018

(87) PCT Pub. No.: WO2017/096780
PCT Pub. Date: Jun. 15, 2017

(65) Prior Publication Data
US 2019/0067466 A1    Feb. 28, 2019

(30) Foreign Application Priority Data

Dec. 7, 2015   (CN) .......................... 201510888548.9
Dec. 7, 2015   (CN) .......................... 201510888884.3
Jun. 17, 2016  (CN) .......................... 201610439233.0

(51) Int. Cl.
*H01L 29/66*   (2006.01)
*H01L 29/78*   (2006.01)
(Continued)

(52) U.S. Cl.
CPC ...... *H01L 29/785* (2013.01); *H01L 21/02381* (2013.01); *H01L 21/02532* (2013.01);
(Continued)

(58) Field of Classification Search
USPC .................. 257/192, 401, 288; 438/172, 197
See application file for complete search history.

(56) References Cited

U.S. PATENT DOCUMENTS 7,538,391 B2 *  5/2009  Chidambarrao .... H01L 29/0649
                                                     257/347
7,989,846 B2    8/2011  Furuta
(Continued)

FOREIGN PATENT DOCUMENTS

CN   101339947 A   1/2009
CN   103456638 A   12/2013
(Continued)

OTHER PUBLICATIONS

Chinese Second Office Action dated Jan. 4, 2019 for Chinese Patent Application No. 201510888884.3.
(Continued)

*Primary Examiner* — Niki H Nguyen
(74) *Attorney, Agent, or Firm* — Christensen, Fonder, Dardi & Herbert PLLC

(57) ABSTRACT

A semiconductor device having a high-quality epitaxial layer and a method of manufacturing the same are provided. According to an embodiment, the semiconductor device may include: a substrate; a first fin-shaped semiconductor layer spaced apart from the substrate, wherein the first semiconductor layer extends along a curved longitudinal extending direction; and a second semiconductor layer at least partially surrounding a periphery of the first semiconductor layer.

36 Claims, 12 Drawing Sheets

(51) Int. Cl.
  *H01L 21/308* (2006.01)
  *H01L 21/02* (2006.01)
  *H01L 21/762* (2006.01)
  *H01L 29/06* (2006.01)
  *H01L 29/165* (2006.01)
  *H01L 21/027* (2006.01)
  *H01L 21/266* (2006.01)
  *H01L 21/311* (2006.01)
  *H01L 21/3213* (2006.01)
  *H01L 29/267* (2006.01)

(52) U.S. Cl.
  CPC .... *H01L 21/02636* (2013.01); *H01L 21/3081* (2013.01); *H01L 21/3083* (2013.01); *H01L 21/3086* (2013.01); *H01L 21/762* (2013.01); *H01L 29/0649* (2013.01); *H01L 29/165* (2013.01); *H01L 29/66795* (2013.01); *H01L 21/0217* (2013.01); *H01L 21/0228* (2013.01); *H01L 21/0273* (2013.01); *H01L 21/02538* (2013.01); *H01L 21/266* (2013.01); *H01L 21/31116* (2013.01); *H01L 21/32133* (2013.01); *H01L 21/32139* (2013.01); *H01L 21/76224* (2013.01); *H01L 29/267* (2013.01)

(56) References Cited

U.S. PATENT DOCUMENTS

| | | | |
|---|---|---|---|
| 8,373,165 B2 * | 2/2013 | Son | H01L 29/785 257/365 |
| 2005/0148137 A1 | 7/2005 | Brask et al. | |
| 2007/0045748 A1 | 3/2007 | Booth, Jr. et al. | |
| 2008/0116517 A1 | 5/2008 | Anderson et al. | |
| 2008/0164535 A1 | 7/2008 | Chidambarrao et al. | |
| 2009/0090934 A1 | 4/2009 | Tezuka et al. | |
| 2010/0059807 A1 * | 3/2010 | Cho | H01L 29/785 257/306 |
| 2011/0175166 A1 * | 7/2011 | Bedell | H01L 29/7849 257/351 |
| 2012/0319211 A1 * | 12/2012 | van Dal | H01L 21/823821 257/401 |
| 2014/0151810 A1 | 6/2014 | Maeda et al. | |
| 2015/0034899 A1 | 2/2015 | Ching et al. | |
| 2015/0041923 A1 * | 2/2015 | Lu | H01L 21/31111 257/401 |
| 2015/0162437 A1 | 6/2015 | Oh et al. | |
| 2015/0255548 A1 * | 9/2015 | Holland | H01L 29/1054 438/429 |
| 2016/0027779 A1 * | 1/2016 | Loo | H01L 27/0922 257/190 |
| 2016/0035891 A1 * | 2/2016 | Xu | H01L 29/785 257/288 |
| 2017/0077232 A1 * | 3/2017 | Balakrishnan | H01L 29/66787 |
| 2017/0162697 A1 | 6/2017 | Zhu | |
| 2018/0102419 A1 * | 4/2018 | Ching | H01L 29/785 |
| 2018/0277682 A1 * | 9/2018 | Zhu | H01L 29/42392 |
| 2019/0305085 A1 * | 10/2019 | Sung | H01L 29/42376 |

FOREIGN PATENT DOCUMENTS

| | | |
|---|---|---|
| CN | 105633167 A | 6/2016 |
| WO | WO 2015/047354 A1 | 4/2015 |

OTHER PUBLICATIONS

U.S. Pat. Office Action dated Nov. 1, 2017 for U.S. Appl. No. 15/368,629 (12 pages).
Chinese Patent Office Action dated Apr. 11, 2018 for Chinese Patent Application No. 201510888884.3 (7 pages).

* cited by examiner

US 11,038,057 B2

SEMICONDUCTOR DEVICE WITH HIGH-QUALITY EPITAXIAL LAYER AND METHOD OF MANUFACTURING THE SAME

CROSS-REFERENCE TO RELATED APPLICATION(S)

The present application is a National Phase entry of PCT Application No. PCT/CN2016/087244, filed Jun. 27, 2016, which claims priority to Chinese Patent Application No. 201610439233.0, filed on Jun. 17, 2016, and Chinese Patent Application No. 201510888548,9, filed on Dec. 7, 2015, and Chinese Patent Application No. 201510888884.3, filed on Dec. 7, 2015, which are incorporated herein by reference in their entirety.

TECHNICAL FIELD

The present disclosure relates to the field of semiconductors, and more particularly, to a semiconductor device having a high-quality epitaxial layer and a method of manufacturing the same.

BACKGROUND

With the development of semiconductor devices, it is desirable to manufacture high-performance semiconductor devices such as Metal-Oxide-Semiconductor Field-Effect Transistors (MOSFETs) with a semiconductor material of higher mobility than that of silicon (Si). However, it is difficult to form a high-quality semiconductor material of high mobility.

SUMMARY

In view of the above, the present disclosure aims to provide, among others, a semiconductor device having a high-quality epitaxial layer and a method of manufacturing the same.

According to an aspect of the present disclosure, there is provided a semiconductor device, comprising: a substrate; a first fin-shaped semiconductor layer spaced apart from the substrate, wherein the first semiconductor layer extends along a curved longitudinal extending direction; and a second semiconductor layer at least partially surrounding a periphery of the first semiconductor layer.

According to another aspect of the present disclosure, there is provided a method of manufacturing a semiconductor device, comprising: forming, on a substrate, a first fin-shaped structure and a second fin-shaped structure extending along a curved longitudinal extending direction, wherein the first fin-shaped structure is stacked on the second fin-shaped structure; forming a supporting portion for supporting the first fin-shaped structure on the first fin-shaped structure and the second fin-shaped structure; at least partially removing a portion of the second fin-shaped structure which is close to the bottom of the first fin-shaped structure, so that the first fin-shaped structure is spaced apart from the second fin-shaped structure to form a first semiconductor layer; and growing a second semiconductor layer with the first semiconductor layer as a seed layer.

According to embodiments of the present disclosure, the second semiconductor layer can be grown with the first curved (thin) semiconductor layer suspended relative to the substrate as a seed layer, and the second semiconductor layer can have high mobility. Such a suspended and curved thin seed layer can enable relaxation of stresses in the first semiconductor layer and the second semiconductor layer, thereby contributing to suppress defects in the first semiconductor layer or the second semiconductor layer.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
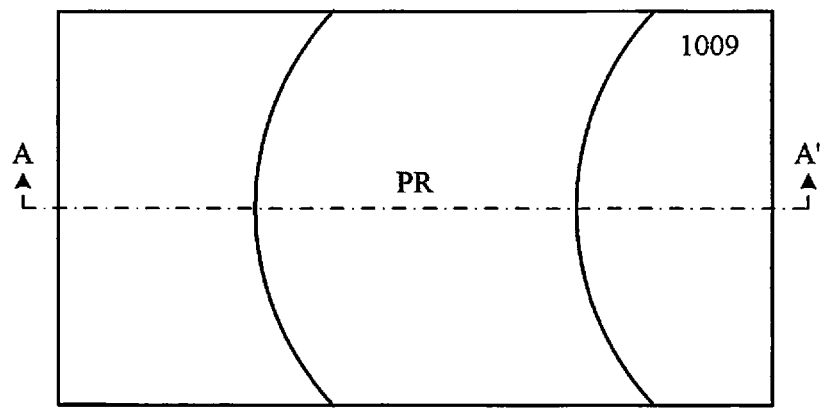
FIGS. 1-16 are schematic views showing a flow of manufacturing a semiconductor device according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor device having a suspended fin structure. Here, the so-called "fin structure" refers to a structure protruding with respect to a surface of a substrate, including, but not limited to, a fin in a Fin Field Effect Transistor (FinFET); and the so-called "suspended" refers to that the fin is spaced apart from the substrate. It is to be noted that a spacing between the fin and the substrate may be filled with another material (for example, an isolation layer). The fin may comprise a semiconductor material of high mobility, to improve performances of the device. Here, the so-called "high mobility" refers to higher mobility than that of silicon (Si). The semiconductor material of high mobility comprises, for example, Ge, SiGe, a III-V compound semiconductor, or the like.

The fin may be a second semiconductor layer formed (for example, epitaxially grown) on a first semiconductor layer above and spaced apart from the substrate. The first semiconductor layer may be in a fin shape which extends in a curved longitudinal extending direction (for example, substantially in a "C" or "S" shape) and is suspended relative to the substrate. Then, the second semiconductor layer may be formed to at least partially surround a periphery of the first semiconductor layer, so that the second semiconductor layer is also in a fin shape and can then be used as the fin of the device. Here, the so-called "partially surround(ing)" refers to that there may be an extent of the first semiconductor layer in the longitudinal extending direction thereof in which the second semiconductor layer can completely enclose an external surface of the first semiconductor layer. That is, in this extent, the second semiconductor layer may form a closed pattern in a cross section perpendicular to the longitudinal extending direction of the first semiconductor layer (for example, a rectangle, a polygon or the like corresponding to a shape of the cross section of the first semiconductor layer). Of course, the first semiconductor layer may have its surface, other than those covered by a supporting portion, covered by the second semiconductor layer. The first semiconductor layer may be relatively thin (for example, with a thickness of about 3-20 nm) and is suspended relative to the substrate. In this way, stresses in the first semiconductor layer and the second semiconductor layer can be relaxed in the growth process, and therefore it is possible to suppress or avoid defects occurring in the first semiconductor layer or the second semiconductor layer.

The first semiconductor layer may be physically connected to the substrate through the supporting portion and thus is supported by the substrate. The first semiconductor layer has a portion connected to the supporting portion, which may have an extent, in the longitudinal extending direction of the first semiconductor layer, less than a length of the first semiconductor layer in the longitudinal extending direction. In this way, when only a positional relationship among the first semiconductor layer, the substrate and the supporting portion is observed (without considering other layer structures), the first semiconductor layer is similar to a cantilever, and the supporting portion is similar to an anchor of the cantilever.

The supporting portion may comprise a laterally extending portion extending along the surface of the substrate and a vertically extending portion extending in a direction substantially perpendicular to the surface of the substrate, wherein the vertically extending portion extends onto vertical sidewalls of the first semiconductor layer which are substantially perpendicular to the surface of the substrate. In this way, the first semiconductor layer is physically connected to the substrate via the supporting portion and thus is supported by the substrate. The vertically extending portion of the supporting portion may extend on the vertical sidewalls on opposite sides of the first semiconductor layer to sandwich the first semiconductor layer.

The supporting portion may be positioned at opposite ends of the first fin-shaped semiconductor layer.

In a case of a field effect transistor, the substrate may have an isolation layer formed thereon to electrically isolate a gate stack of the field effect transistor from the substrate. The isolation layer may fill a spacing between the first semiconductor layer and the substrate and a spacing between the second semiconductor layer and the substrate, and may at least partially expose the second semiconductor layer. For example, the isolation layer may have a portion under the second semiconductor layer, which is contiguous to the second semiconductor layer, and have remaining portions whose top surface is closer to the substrate than a bottom surface of the second semiconductor layer facing the substrate. The isolation layer may have an undercut under the second semiconductor layer. In this way, the gate stack may be embedded into the undercut, so as to effectively control the bottom of a gate.

According to an embodiment, a plurality of devices may be formed based on one same fin (i.e., the second semiconductor layer). For example, devices may be respectively formed based on different portions of the fin along the longitudinal extending direction thereof. In a case of field effect transistors, there may be more than one, for example, two or more, gate stacks intersecting the same fin (i.e., the second semiconductor layer), to form corresponding devices respectively. For example, the gate stack may comprise a first gate stack and a second gate stack which are spaced apart from each other in the longitudinal extending direction of the fin. The first gate stack may intersect a first portion of the fin in the longitudinal extending direction (i.e., a portion of the second semiconductor layer surrounding a periphery of a first portion of the first semiconductor layer along the longitudinal extending direction thereof), and the second gate stack may intersect a second portion of the fin in the longitudinal extending direction (i.e., a portion of the second semiconductor layer surrounding a periphery of a second portion of the first semiconductor layer along the longitudinal extending direction thereof). Devices corresponding to the first gate stack and the second gate stack may be spaced apart from each other. For example, a dielectric layer may be formed to separate the first portion and the second portion of the first semiconductor layer. The dielectric layer may extend in a direction intersecting the longitudinal extending direction of the first semiconductor layer, and may further separate different portions of the second semiconductor layer.

Such a semiconductor device can be manufactured, for example, as follows. Specifically, a first fin-shaped structure and a second fin-shaped structure, which are curved (for example, substantially "C"-shaped or "S"-shaped) along their longitudinal extending direction, may be formed on the substrate, wherein the first fin-shaped structure is stacked on the second fin-shaped structure. After that, when at least a portion of the second fin-shaped structure which is close to the bottom of the first fin-shaped structure is removed, the first fin-shaped structure may be spaced apart from the second fin-shaped structure to form a first semiconductor layer, which may be suspended relative to the substrate (in other words, relative to the substrate and remaining portions of the second fin-shaped structure).

In order to support the first semiconductor layer which is to be suspended, a supporting portion may be formed. This supporting portion may be formed as follows. Specifically, a film material (which is referred to as a supporting layer below) may be formed on the substrate with the first fin-shaped structure and the second fin-shaped structure formed thereon, and the supporting portion is formed by patterning the supporting layer to physically connect a surface of the first fin-shaped structure to a surface of the second fin-shaped structure. In this way, when at least the portion of the second fin-shaped structure which is close to the bottom of the first fin-shaped structure is removed, the first semiconductor layer may be physically connected to the remaining portions of the second fin-shaped structure through the supporting portion, and therefore is supported by the remaining portions of the second fin-shaped structure. Further, the supporting layer may be patterned into the supporting portion which extends from the surface of the substrate to the surface of the first fin-shaped structure and therefore physically connects the first fin-shaped structure to the substrate. In this way, even if the second fin-shaped structure is completely removed, the first semiconductor layer may also be physically connected to the substrate through the supporting portion and therefore is supported by the substrate.

The supporting layer may be patterned with a mask. The mask extends on the first fin-shaped structure and the second fin-shaped structure beyond an extent of the first fin-shaped structure and the second fin-shaped structure in a direction perpendicular to the longitudinal extending direction of the first fin-shaped structure and the second fin-shaped structure (in this way, the mask can shield some portions of the supporting layer extending on the surface of the substrate on opposite sides of the first fin-shaped structure and the second fin-shaped structure, so that those portions can then be remained); and the mask covers only a fraction of a length of the first fin-shaped structure and the second fin-shaped structure in the longitudinal extending direction of the first fin-shaped structure and the second fin-shaped structure (in this way, the mask shields only a fraction of the longitudinal extent of the first fin-shaped structure and the second fin-shaped structure, so that this portion can then be connected to the supporting portion). The mask may cover opposite ends of the first fin-shaped structure and the second fin-shaped structure, and accordingly the resulting supporting portion may be positioned at the opposite ends of the first fin-shaped structure and the second fin-shaped structure.

After that, at least a portion of the second fin-shaped structure which is close to the first fin-shaped structure may be removed. In this way, the first semiconductor layer is similar to a cantilever relative to the substrate, and the supporting portion is similar to an anchor of the cantilever to anchor the first semiconductor layer as a cantilever to the substrate.

In order to facilitate removal the portion of the second fin-shaped structure which is close to the bottom of the first fin-shaped structure or even remove the entire second fin-shaped structure, the second fin-shaped structure may comprise a sacrificial layer formed on the substrate, and the first fin-shaped structure may comprise the first semiconductor layer stacked on the sacrificial layer. For example, the sacrificial layer and the first semiconductor layer may be formed in sequence on the substrate, and then patterned into the fin-shaped structure. The patterning step may be carried out into the substrate, so that a protrusion may be formed on the substrate at a position corresponding to the fin-shaped structure. Then, the sacrificial layer may be selectively removed.

As the first semiconductor layer is suspended and thereby surfaces thereof are exposed, a second semiconductor layer may be grown on the surfaces. Then, in a case of sufficient growth, all the surfaces of the first semiconductor layer (exposed by the supporting portion) may be covered by the second semiconductor layer. This second semiconductor layer may also be in a (curved) fin shape as the first semiconductor layer, and then act as a fin of the device.

There are various ways to manufacture the device based on the fin. For example, an isolation layer may be formed on the substrate, and a gate stack intersecting the second semiconductor layer may be formed on the isolation layer. The isolation layer may fill a spacing between the first semiconductor layer and the substrate and a spacing between the second semiconductor layer and the substrate, and may at least partially expose the second semiconductor layer. The isolation layer may be obtained by depositing a dielectric such as oxide and then etching it back. The supporting portion may have a material different from that of the isolation layer so that the supporting portion may not be attacked in the back-etching process. The isolation layer may be etched back in such a way that it has a portion under the second semiconductor layer, which is contiguous to the second semiconductor layer, and has remaining portions whose top surface is closer to the substrate than a bottom surface of the second semiconductor layer facing the substrate. In addition, in the back-etching process, an undercut may be formed under the second semiconductor layer.

In addition, in forming the gate stack, as described above, two or more gate stacks intersecting one same fin may be formed to result in corresponding devices respectively. Isolation may be formed between the respective devices according to design requirements. For example, a dielectric layer extending in a direction intersecting the longitudinal extending direction of the first semiconductor layer may be formed on the isolation layer, and the dielectric layer may divide the first semiconductor layer into a first portion and a second portion, and may divide second semiconductor layer into a first portion and a second portion. The gate stack may be formed to include a first gate stack intersecting the first portion of the second semiconductor layer and a second gate stack intersecting the second portion of the second semiconductor layer.

The present disclosure may be implemented in various forms, and some examples thereof will be described below.

Figure 1B:
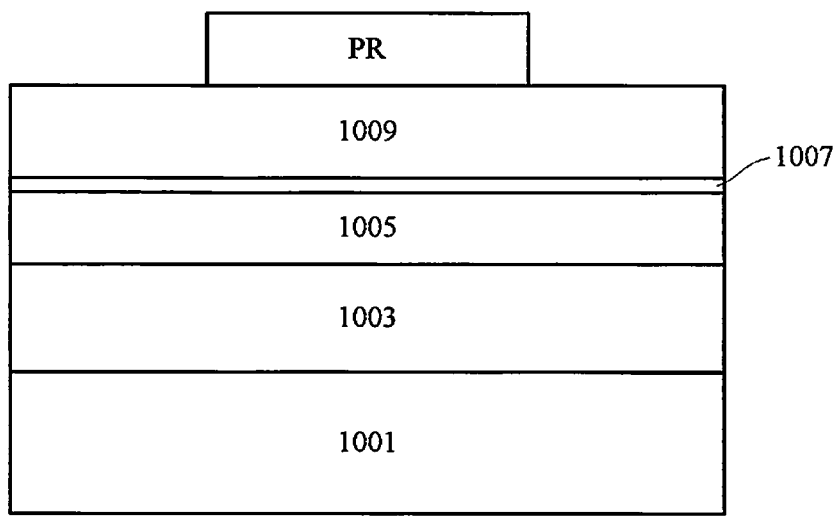

As shown in FIGS. 1(a) and 1(b) (FIG. 1(a) is a top view, and FIG. 1(b) is a sectional view along line AA' in FIG. 1(a)), a substrate 1001 is provided. The substrate 1001 may be a substrate in any form, for example, but not limited to, a bulk semiconductor substrate such as a bulk Si substrate or the like. Hereinafter, the bulk Si substrate will be described by way of example for convenience of description.

A sacrificial layer 1003 and a first semiconductor layer 1005 are formed in sequence on the substrate 1001 by, for example, epitaxy. The sacrificial layer 1003 may include a different semiconductor material from those of the substrate 1001 and the first semiconductor layer 1005, for example, SiGe (wherein Ge may have an atomic percentage of, for example, about 5-20%), with a thickness of 10-100 nm. The first semiconductor layer 1005 may include a suitable semiconductor material, such as Si, with a thickness of about 10-100 nm.

Then, the first semiconductor layer 1005 and the sacrificial layer 1003 (and optionally, the substrate 1001) which are formed in such a way may be patterned to form a fin-shaped structure. For example, this can be done as follows.

Specifically, a hard mask layer may be formed on the first semiconductor layer 1005. In this example, the hard mask layer may comprise an oxide (for example, silicon oxide) layer 1007 and a polysilicon layer 1009. For example, the oxide layer 1007 has a thickness of about 2-10 nm, and the polysilicon layer 1009 has a thickness of about 50-120 nm. In this example, the hard mask is patterned into a fin-like shape using the pattern transfer technology. To this end, patterned (for example, through exposure and development) photoresist PR may be formed on the hard mask layer. Here, the photoresist PR is patterned into a strip extending in a curved form, and may have a width (a dimension in a horizontal direction in the figure) substantially corresponding to a spacing between two fin-shaped structures. The curved shape may be an arc shape, an arcuate shape, a polynomial curve, a combination thereof, or the like. In this example, the photoresist PR is patterned to be substantially "C" shaped.

Figure 2:
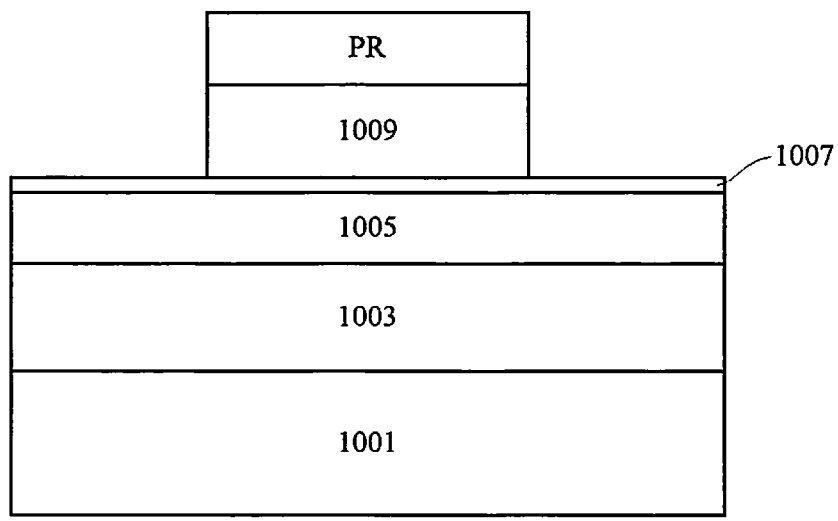
Figure 3A:
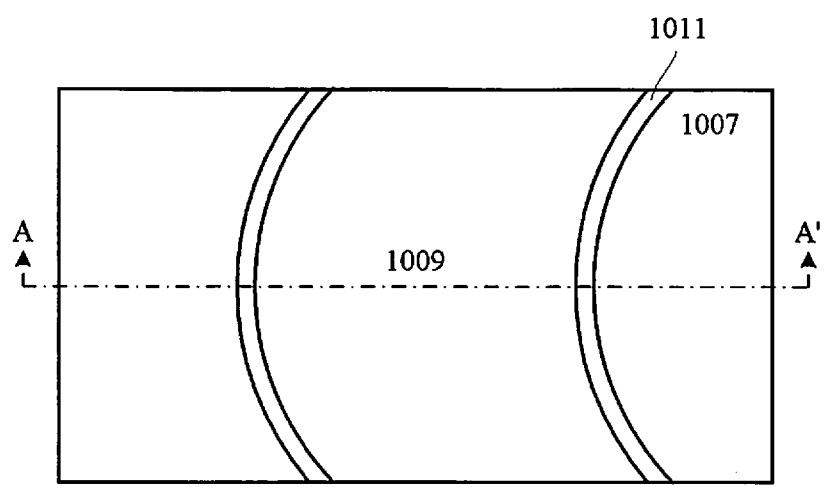
Figure 3B:
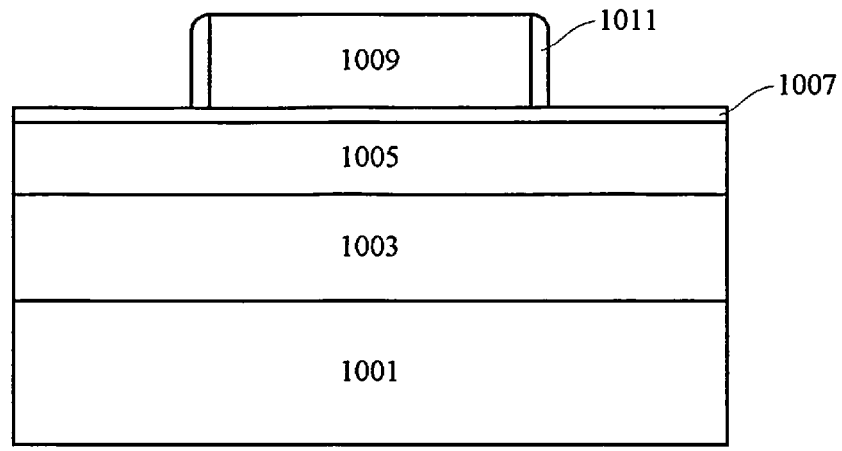
Figure 4:
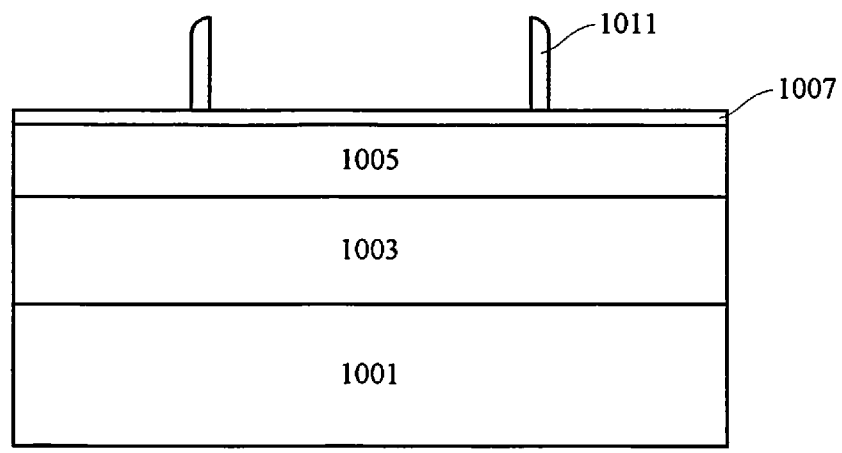

Next, as shown in FIG. 2, the polysilicon layer 1009 is selectively etched (relative to the oxide layer 1007) by, for example, Reactive Ion Etching (RIE) with the photoresist PR as a mask. In this way, the polysilicon layer 1009 may be patterned into a curved strip corresponding to the photoresist PR. Then, as shown in FIGS. 3(*a*) and 3(*b*) (FIG. 3(*a*) is a top view, and FIG. 3(*b*) is a sectional view along line AA' in FIG. 3(*a*)), the photoresist PR is removed and a spacer 1011 is formed on sidewalls of the polysilicon layer 1009. There are various ways in the art to form the spacer. For example, a nitride (for example, silicon nitride) layer with a thickness of, for example, about 3-20 nm may be deposited in a substantially conformal way by, for example, Atomic Layer Deposition (ALD), and then the deposited nitride layer may be selectively etched by, for example, RIE, to remove a laterally extending portion thereof so that a vertically extending portion thereof is remained to form the spacer 1011. The spacer 1011 covers the sidewalls of the silicon layer 1009. Then, as shown in FIG. 4 (corresponding to the sectional view in FIG. 3(*b*)), the polysilicon layer 1009 may be selectively removed (for example, by TMAH solution).

It is to be noted that although not shown in FIG. 3(*a*), the spacer 1011 also exists on upper and lower sidewalls of the strip-shaped polysilicon layer 1009, and thereby the spacer 1011 forms a closed pattern surrounding a periphery of the strip-shaped polysilicon layer 1009. The upper and lower portions of the spacer 1011 may be removed by, for example, photolithography, so that the spacer 1011 which is originally in the closed pattern can be separated into two portions. Each of the portions corresponds to a fin-shaped structure to be formed, which in this example constitutes a corresponding one of the two "C"-shaped strips as shown in FIG. 3(*a*).

Figure 5:
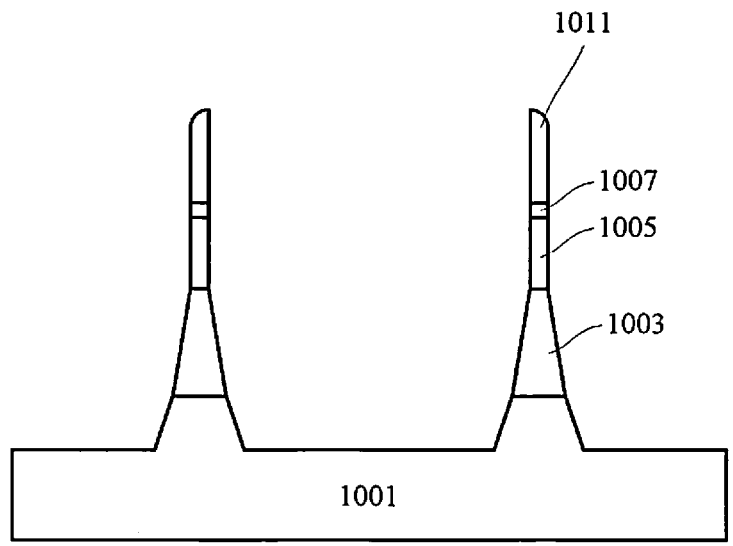
Figure 6:
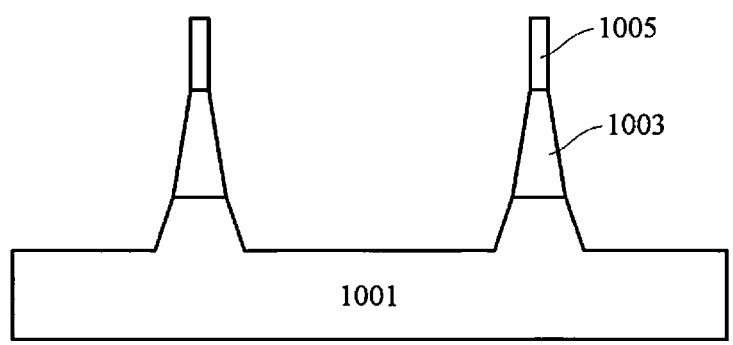

Then, as shown in FIG. 5, the oxide layer 1007, the first semiconductor layer 1005 and the sacrificial layer 1003 may be selectively etched in sequence by, for example, RIE, with the spacer 1011 as a mask. In this way, the pattern of the spacer 1011 is transferred into the underlying layers, resulting in the fin-shaped structure. Here, the fin-shaped structure comprises a first fin-shaped structure formed of the semiconductor layer 1005 and a second fin-shaped structure formed of the sacrificial layer 1003. Therefore, the first semiconductor layer 1005 has a width (a dimension in a horizontal direction in the figure) which is substantially the same as that of the spacer 1011 (for example, about 3-20 nm). Here, the substrate 1001 may be further selectively etched. Therefore, the substrate 1001 may have a protrusion thereon at a position corresponding to the fin-shaped structure. The fin-shaped structure has a projection on the substrate at substantially the middle of the protrusion. Due to characteristics of etching, the etched sacrificial layer 1003 and the protrusion of the substrate 1001 each may have a shape increasingly enlarged from top down. Then, the spacer 1011 may be selectively removed and the oxide layer 1007 may be further selectively removed, as shown in FIG. 6.

Although the fin-shaped structure is formed by using the pattern transfer technology as described above, the present disclosure is not limited thereto. For example, curved fin-shaped photoresist may be formed directly on the first semiconductor layer 1005, and the first semiconductor layer 1005, the sacrificial layer 1003 and the substrate 1001 may be selectively etched with the photoresist as a mask to form a curved fin-shaped structure. Alternatively, curved fin-shaped photoresist may be formed directly on the hard mask layer, the hard mask layer may be patterned into a curved fin-like shape by using the photoresist, and the first semiconductor layer 1005, the sacrificial layer 1003 and the substrate 1001 may be selectively etched in sequence with the curved fin-shaped hard mask layer to form a curved fin-shaped structure.

Here, although two fin-shaped structures are illustrated, the present disclosure is not limited thereto. For example, more or less fin-shaped structures may be formed. Further, a layout of the fin-shaped structures may be differently designed according to requirements for the device.

Figure 7:
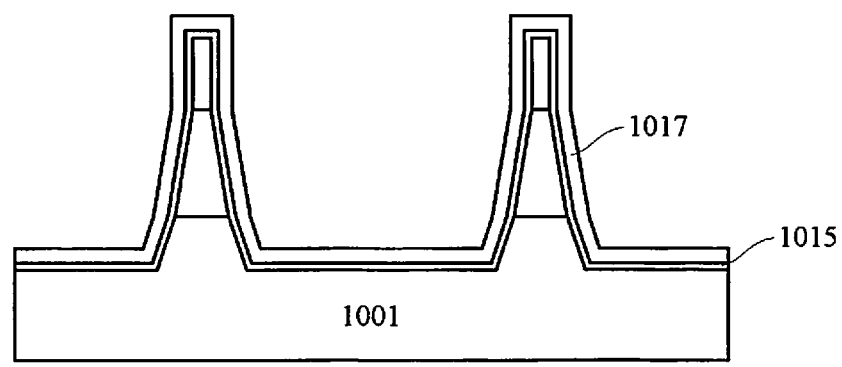

After the fin-shaped structures are formed, a supporting portion may be formed. For example, as shown in FIG. 7, an oxide layer 1015 and a nitride layer 1017 may be formed by, for example, ALD in a substantially conformal way on the substrate with the fin-shaped structures formed thereon. The oxide layer 1015 may have a thickness of about 1-10 nm, and the nitride layer 1017 may have a thickness of about 2-15 nm. Then, as illustrated in the top view of FIG. 8, patterned photoresist 1019 may be formed on the structure illustrated in FIG. 7. The photoresist 1019 is patterned to cover opposite ends (upper and lower ends in the figure) of the fin-shaped structures and extend in a horizontal direction in the figure. It is to be noted here that in the top view of FIG. 8, the topography of the nitride layer 1017 which fluctuates along with the fin-shaped structures on the substrate is not shown merely for convenience, and the same is true for the following top views.

Figure 9A:
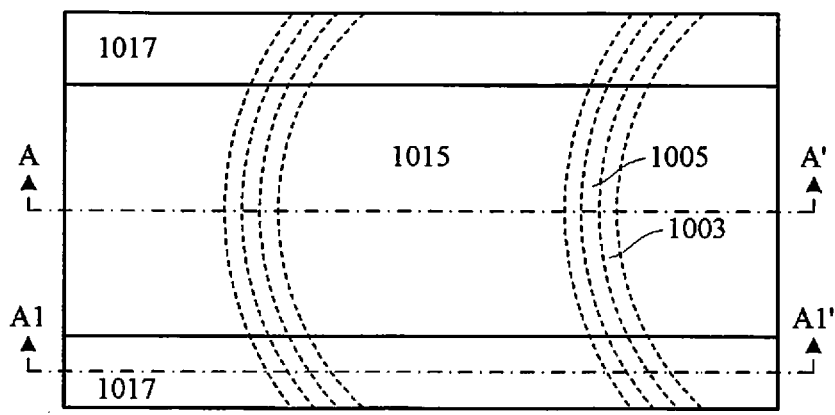
Figure 9B:
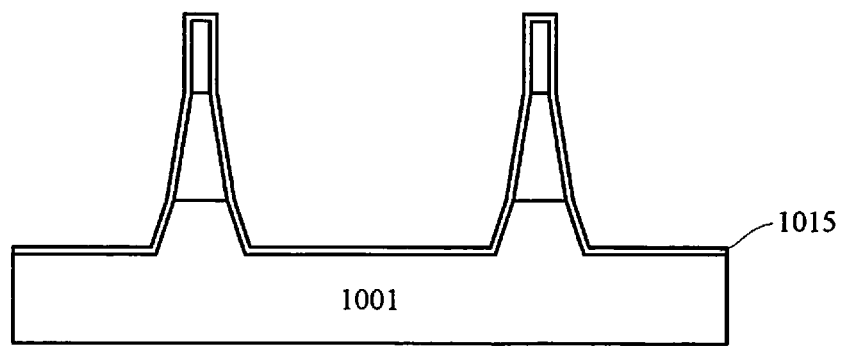
Figure 9C:
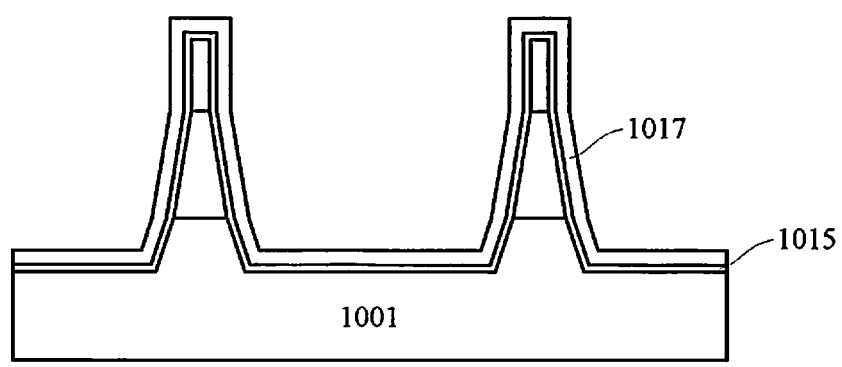

Then, as shown in FIGS. 9(*a*), 9(*b*) and 9(*c*) (FIG. 9(*a*) is a top view, FIG. 9(*b*) is a sectional view along line AA' in FIG. 9(*a*), and FIG. 9(*c*) is a sectional view along line A1A1' in FIG. 9(*a*)), the nitride layer 1017 is selectively removed by, for example, RIE (relative to the oxide layer 1015) with the photoresist 1019 as a mask. In this way, as shown in FIG. 9(*c*), the nitride layer 1017 is remained at opposite ends (upper and lower ends in FIG. 9(*a*)) of the fin-shaped structures and extends onto the surface of the substrate 1001. In this way, the fin-shaped structures are physically connected to the substrate 1001 by the nitride layer 1017, and thus can be supported by the substrate 1001 (particularly after the sacrificial layer 1003 are removed as described below). Then, the photoresist 1019 may be removed.

In the present embodiment, a supporting layer which is a stack of the oxide layer and the nitride layer is formed, and the supporting layer is patterned into a supporting portion. However, the present disclosure is not limited thereto. The supporting layer may comprise various suitable dielectric materials. In an embodiment in which the supporting portion is subsequently removed, the supporting layer may even comprise a semiconductor material or a conductive material.

It should be noted here that, for convenience of illustration only, the sectional view shown in FIG. 9(*c*) and the top view shown in FIG. 9(*a*) are shifted in position (particularly positions of the two fin-shaped structures in FIG. 9(*c*).) The same is true for the following sectional views.

Figure 10:
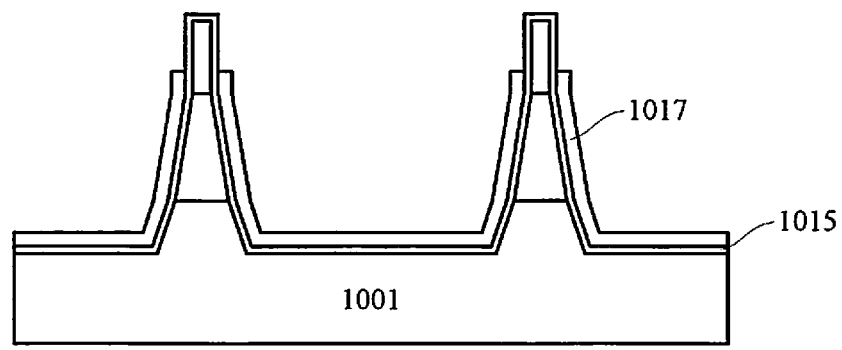

Further, as shown in FIG. 10 (corresponding to the sectional view in FIG. 9(*c*)), an upper end of the nitride layer 1017 may also be selectively removed, for example, by RIE (relative to the oxide layer 1015). However, a part of the nitride layer 1017 is remained on the sidewalls of the first semiconductor layer 1005 to subsequently support the first semiconductor layer 1005.

Then, as shown in FIGS. 11(*a*) and 11(*b*) (FIG. 11(*a*) corresponds to the sectional view in FIG. 9(*b*), and FIG. 11(*b*) corresponds to the sectional view in FIG. 9(*c*)), the oxide layer 1015 may be selectively removed by, for example, ME (relative to the substrate 1001 and the first semiconductor layer 1005 of Si and the sacrificial layer 1003 of SiGe). As shown in FIG. 11(*a*), the middle of the fin-shaped structure is completely exposed. In addition, as shown in FIG. 11(*b*), the oxide layer 1015 is covered by the nitride layer 1017 and thus can be remained on the opposite ends of the fin-shaped structure. Then, as shown in FIGS.

Figure 11A:
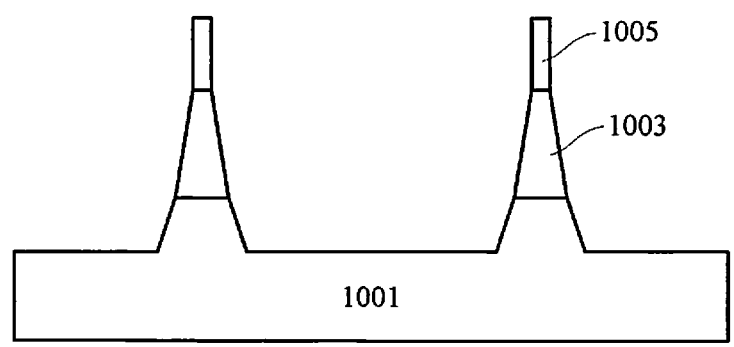
Figure 11B:
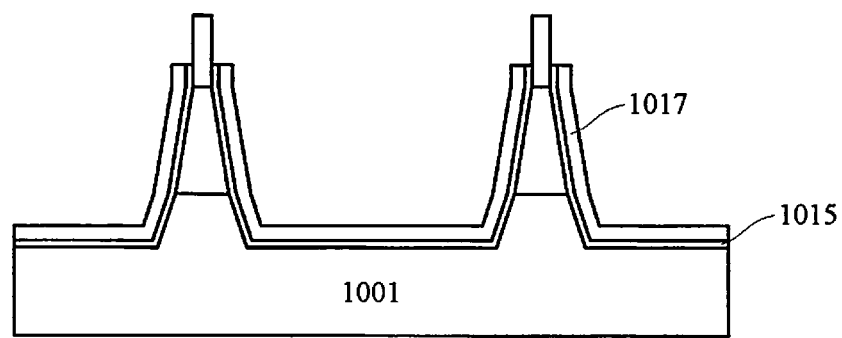

12(a) and 12(b) (sectional views corresponding to those of FIGS. 11(a) and 11(b), respectively), the sacrificial layer 1003 may be selectively removed by, for example, wet etching (relative to the substrate 1001 and the first semiconductor layer 1005 of Si). In this way, a spacing 1021 is formed between the first fin-shaped semiconductor layer 1005 and the substrate 1001.

In this example, the sacrificial layer 1003 is completely removed. However, the present disclosure is not limited thereto. For example, only a portion of the sacrificial layer 1003 which is close to the bottom of the first semiconductor layer 1005 may be removed. In this case, growth surrounding the periphery of the first semiconductor layer 1005 may also be achieved as follows.

Figure 12A:
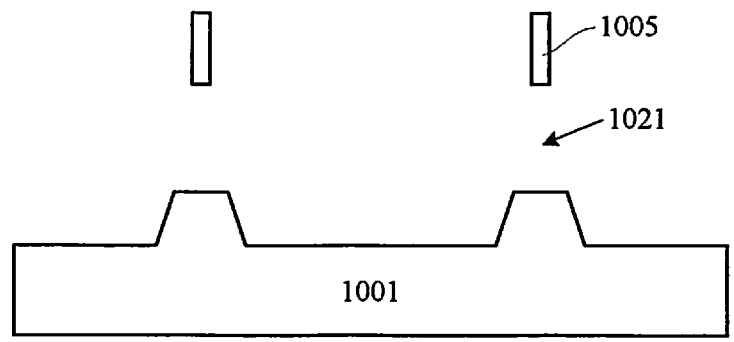
Figure 12B:
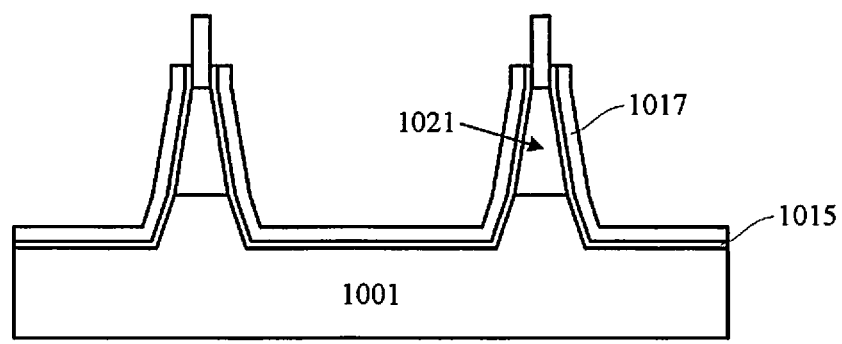

As shown in FIGS. 12(a) and 12(b), the first semiconductor layer 1005 is spaced apart from the substrate 1001 by the spacing 1021, extends substantially in parallel to the surface of the substrate, and is supported by the substrate 1001 through the supporting portion 1015/1017. The supporting portion 1015/1017 comprises a laterally extending portion which extends on the surface of the substrate 1001 and a vertically extending portion which extends in a direction substantially perpendicular to the surface of the substrate. In this example, the vertically extending portion may comprise a portion extending along surfaces of the protrusion of the substrate 1001, a portion extending along a surface of the sacrificial layer 1003 (which has been removed) and also a portion extending along the vertical sidewalls of the first semiconductor layer 1005. In this way, the supporting portion 1015/1017 physically connects the first semiconductor layer 1005 to the substrate 1001, and thus can support the first semiconductor layer 1005. The supporting portion 1015/1017 may extend on the vertical sidewalls of the first semiconductor layer 1005 on two opposite sides (left side and right side in the figure), so as to sandwich the first semiconductor layer, thereby more stably supporting the first semiconductor layer 1005. A portion of the first semiconductor layer 1005 connected to the supporting portion 1015/1017 has an extent in a longitudinal extending direction of the first semiconductor layer 1005 which is less than a length of the first semiconductor layer 1005 in the longitudinal extending direction. Here, the so-called "longitudinal extending direction" refers to a lengthwise direction of the first semiconductor layer 1005, which is substantially the same as a length direction of a channel which is then formed, that is, a direction from a source to a drain, and vice versa. In this way, the first semiconductor layer 1005 looks like a cantilever relative to the substrate 1001, and the cantilever is anchored to the substrate 1001 by the supporting portion 1015/1017.

In the above example, in addition to the nitride layer 1017, the supporting portion further comprises the oxide layer 1015. However, the present disclosure is not limited thereto. For example, in the processes described above in conjunction with FIG. 7, the oxide layer 1015 may not be formed, and instead, the nitride layer 1017 is directly formed. In this way, subsequent processes may also be implemented in the manner described above in conjunction with FIGS. 8-12. Of course, the supporting portion may also comprise other dielectric material(s) or a different stack.

Figure 8:
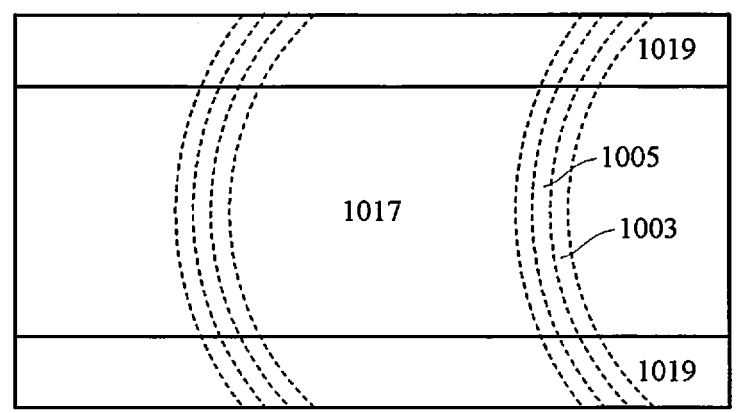

In addition, the mask 1019 which is used to pattern the supporting portion (as shown in FIG. 8) is not limited to the above shape. Generally, the mask may extend on the fin-shaped structure beyond an extent of the fin-shaped structure in a direction perpendicular to the longitudinal extending direction of the fin-shaped structure. In this way, the mask may cover a portion of the nitride layer 1017 extending on the surface of the substrate 1001 (other than the protrusion), and thus this portion can then be remained (as a base of the supporting portion). On the other hand, the mask may cover only a fraction of the length of the fin-shaped structure in the longitudinal extending direction. In this way, a cantilever-anchor like structure may be formed.

Figure 13A:
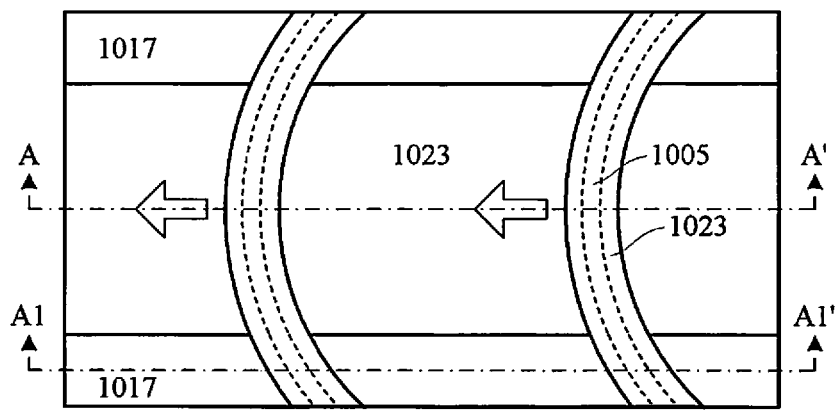
Figure 13B:
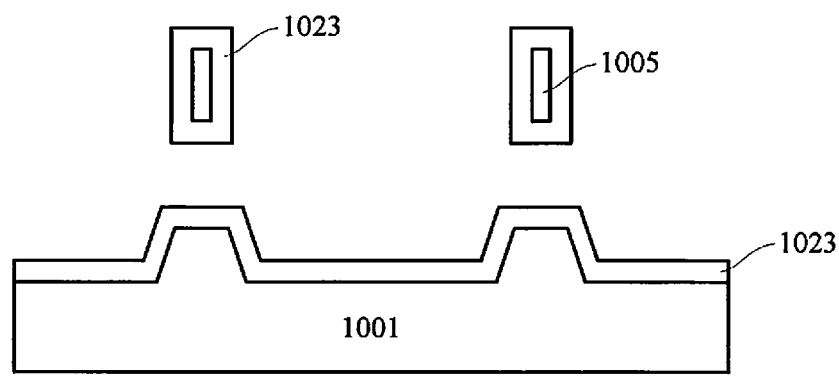
Figure 13C:
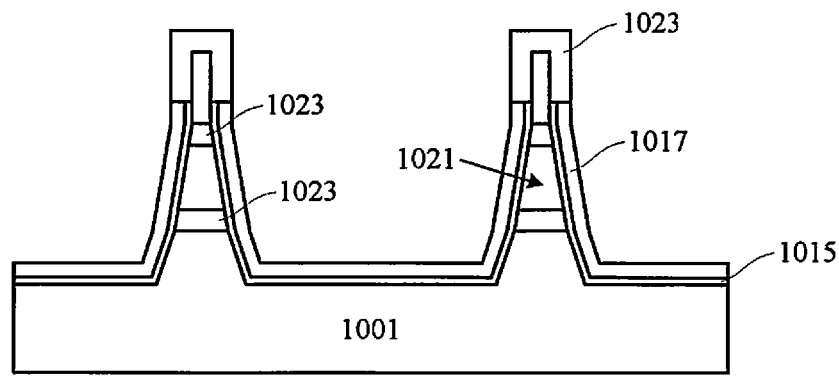

Then, as shown in FIGS. 13(a), 13(b) and 13(c) (FIG. 13(a) is a top view, FIG. 13(b) is a sectional view along line AA' in FIG. 13(a), and FIG. 13(c) is a sectional view along line A1A1' in FIG. 13(a)), a second semiconductor layer 1023 may be grown on the first semiconductor layer 1005. Here, the second semiconductor layer 1023 may comprise a material of high mobility, for example, Ge, SiGe, or a III-V compound semiconductor, such as InSb, InGaSb, InAs, GaAs, InGaAs, AlSb, InP, group-III nitride or the like, with a thickness of about 5-15 nm. In a case of the compound semiconductor such as SiGe, components thereof (for example, an atomic percentage of Ge) may change gradually, so that the compound semiconductor has a lattice constant which changes from being quite similar to that of the first semiconductor layer 1005 (here, Si) to being more different from that of the first semiconductor layer 1005, to suppress dislocations or defects.

The growth may be selective growth, so that the second semiconductor layer 1023 is grown only on the surfaces of the first semiconductor layer 1005 (and also the substrate 1001) of the semiconductor material. The growth of the second semiconductor layer 1023 may be controlled so that the second semiconductor layer 1023 does not completely fill the spacing 1021 between the first semiconductor layer 1005 and the substrate 1001. Due to the suspension configuration of the first semiconductor layer 1005, stresses in the first semiconductor layer 1005 and the second semiconductor layer 1023 can be relaxed in the growth process.

In addition, as shown in FIG. 13(a), the second semiconductor layer 1023, such as a Ge, SiGe, or III-V compound semiconductor layer, has a lattice constant generally greater than that of silicon, and thus the second semiconductor layer 1023 which is grown with the first semiconductor layer 1005 of silicon as a seed may increase in length with respect to the first semiconductor layer 1005. Thus, as shown by the arrows in the figure, the second semiconductor layer 1023 may have its center shifted to the left relative to the original center of the first semiconductor layer 1005. This facilitates release of stresses in the growth process.

In this way, it is possible to suppress or even avoid defects occurring in the first semiconductor layer 1005 or the second semiconductor layer 1023, which contributes to improve performances of the device (for example, reduce an off-state leakage current or increase an on-state current).

In this example, except for surface of the first semiconductor layer 1005 covered by the supporting portion 1015/1017, remaining surfaces of the first semiconductor layer 1005 are covered by the second semiconductor layer. Of course, the second semiconductor layer 1023 may also be grown on the surface of the substrate 1001.

In this example, the first semiconductor layer has a longitudinal extent in the longitudinal extending direction thereof which is not occupied by the supporting portion, and peripheries of which are completely enclosed by the second semiconductor layer 1023. In this way, in a cross section (i.e., the cross section illustrated in FIG. 13(b)) perpendicular to the longitudinal extending direction of the first semiconductor layer 1005, the second semiconductor layer 1023 forms a closed pattern (which is a rectangle in this example). Of course, the closed pattern is decided by a pattern of the first semiconductor layer 1005 in the cross section, and may be in a different shape such as a polygon.

The second semiconductor layer 1023 in such a shape may then act as a fin of the device.

After the fin 1023 is formed by the above processes, a gate stack intersecting the fin may be formed, resulting in the final semiconductor device (for example, FinFET).

Figure 14A:
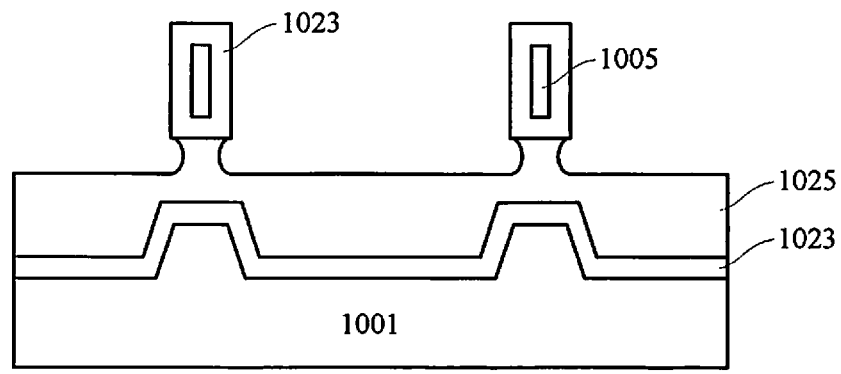
Figure 14B:
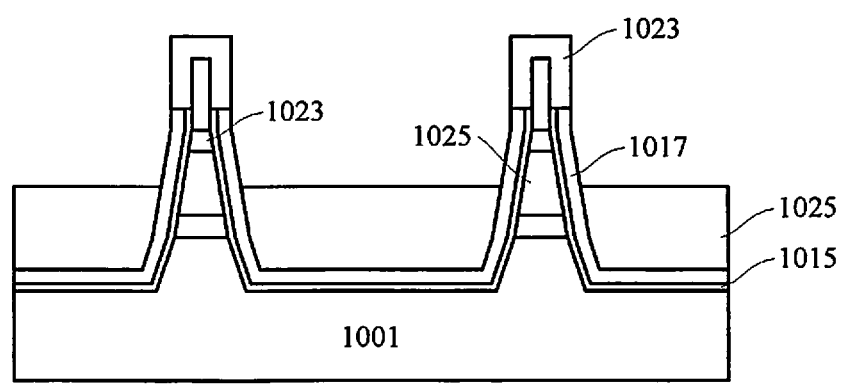

In order to isolate the gate stack from the substrate, as shown in FIGS. 14(*a*) and 14(*b*) (sectional views corresponding to those of FIGS. 13(*b*) and 13(*c*), respectively), an isolation layer 1025 is firstly formed on the substrate 1001 (in this example, on the second semiconductor layer 1023 formed on the substrate 1001). This isolation layer may be formed by, for example, depositing a dielectric material such as oxide on the substrate and then etching it back. In the back-etching process, a back-etching depth is controlled so that the resultant isolation layer 1025 can at least partially expose the second semiconductor layer 1023. In addition, the isolation layer 1025 also fills the spacing 1021. In this example, the isolation layer 1025 has a portion under the second semiconductor layer 1023, which is contiguous to the second semiconductor layer 1023, and has remaining portions whose top surface is lower than a bottom surface of the second semiconductor layer 1023. In addition, the isolation layer 1025 may be formed with an undercut under the second semiconductor layer 1023 (due to the back-etching).

In this embodiment, the isolation layer 1025 substantially fills the spacing between the first semiconductor layer 1005 and the substrate 1001 and the spacing between the second semiconductor layer 1023 and the substrate 1001. However, the present disclosure is not limited thereto. For example, the top surface of the isolation layer 1025 may be separate from the bottom surface of the second semiconductor layer 1023.

Figure 15:
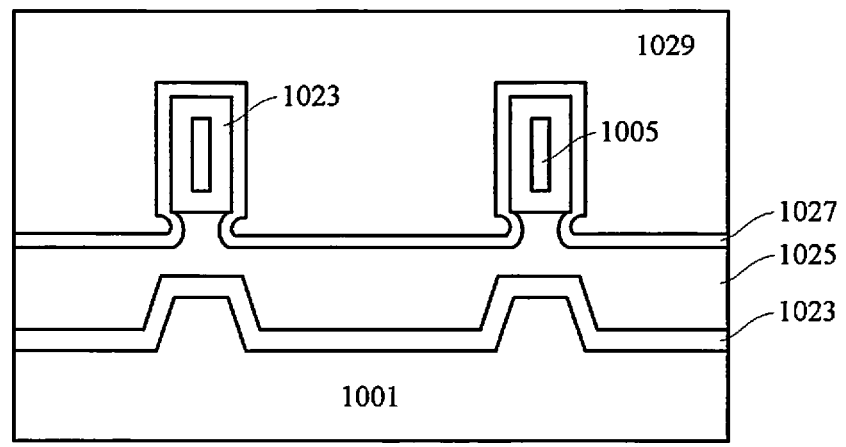

Then, the gate stack intersecting the fin may be formed on the isolation layer 1025. For example, this can be down as follows. Specifically, as shown in FIG. 15 (a sectional view corresponding to that of FIG. 14(*a*)), a gate dielectric layer 1027 and a gate conductor layer 1029 may be formed in sequence. For example, the gate dielectric layer 1027 may comprise oxide (for example, $SiO_2$ or $GeO_2$) with a thickness of about 0.3-2 nm, and the gate conductor layer 1029 may comprise polysilicon. Alternatively, the gate dielectric layer 1027 may comprise a high-K gate dielectric such as $HfO_2$ or $Al_2O_3$ with a thickness of about 1-4 nm, and the gate conductor layer 1029 may comprise a metallic gate conductor. In a case of high-K gate dielectric/metallic gate conductor, a work function adjustment layer (not shown), for example, TiN, Al, Ti, TiAlC, with a thickness of about 1-3 nm may be further formed between the gate dielectric layer 1027 and the gate conductor layer 1029.

Figure 16:
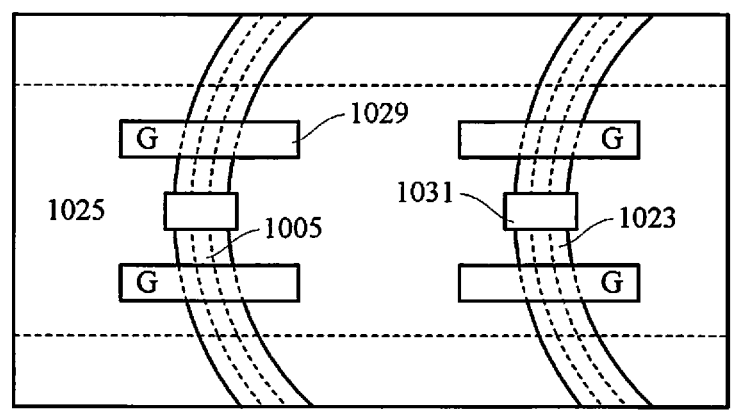

After that, as shown in a top view in FIG. 16, the gate dielectric layer 1027 and the gate conductor layer 1029 may be patterned by, for example, photolithography to form gate stacks G. Here, there are two gate stacks G intersecting one same fin-shaped structure. However, the present disclosure is not limited to this. For example, there may be only one or three or more gate stacks intersecting one same fin-shaped structure. A layout of the gate stack G may depend on the device design.

After the gate stack is formed, halo implantation and extension implantation may be performed with the gate stack as a mask, for example. Next, a gate spacer may be formed on sidewalls of the gate stack. Then, source/drain (S/D) implantation may be performed with the gate stack and the gate spacer as a mask. Then, implanted ions may be activated through annealing to form source/drain regions in the second semiconductor layer 1023 on opposite sides (upper and lower sides in the figure) of the gate stack G.

Those skilled in the art are aware of various ways to manufacture a device based on a fin, and processes after formation of the fin will not be described in detail here.

Each gate stack G and a corresponding portion of the fin 1023 form a corresponding device such as a FinFET. Depending on the device design, these devices may be connected to or isolated from each other. An example of isolation between the devices is shown in FIG. 16. Specifically, as shown in FIG. 16, a dielectric layer 1031 extending in a direction intersecting the longitudinal extending direction of the fin-shaped structure may be formed on the isolation layer 1025 so as to divide the first semiconductor layer 1005 into two isolated portions, and divide the second semiconductor layer 1023 into two isolated portions. Specifically, the second semiconductor layer 1023 and the first semiconductor layer 1005 may be selectively etched by photolithography to form a spacing therein. Then, the spacing is filled with a dielectric material such as oxide to form the dielectric layer 1031.

In this way, the semiconductor device according to the present embodiment is obtained. As shown in FIGS. 15 and 16, the semiconductor device may comprise the first semiconductor layer 1005 spaced apart from the substrate 1001. The first semiconductor layer 1005 is physically connected to the substrate 1001 through the supporting portion 1015/1017 (as shown in FIG. 12(*b*)). The second semiconductor layer 1023 is formed surrounding the periphery of the first semiconductor layer 1005 to act as a fin of the device. In addition, the device further comprises the isolation layer 1025 and the gate stacks G (1027 and 1029) formed on the isolation layer 1025 and intersecting the fin 1023. Due to the undercut of the isolation layer 1025, the gate stacks may be embedded into the undercut, so as to more effectively control the bottom of the fin 1023.

In the present embodiment, in the final device, the supporting portion is remained. However, the present disclosure is not limited thereto. The supporting portion may be selectively (at least partially) removed (for example, after the gate stack is formed), and a space resulting from the removal of the supporting portion may be filled with, for example, another dielectric layer.

In the above embodiment, the supporting portion is formed at opposite ends of the first semiconductor layer, and the opposite ends of the curved fin-shaped structure may be fixed, which is particularly advantageous for the curved fin-shaped structure. However, the present disclosure is not limited thereto, and the supporting portion may also be formed at other position(s) of the first semiconductor layer in addition to the opposite ends or instead of the opposite ends.

Figure 17:
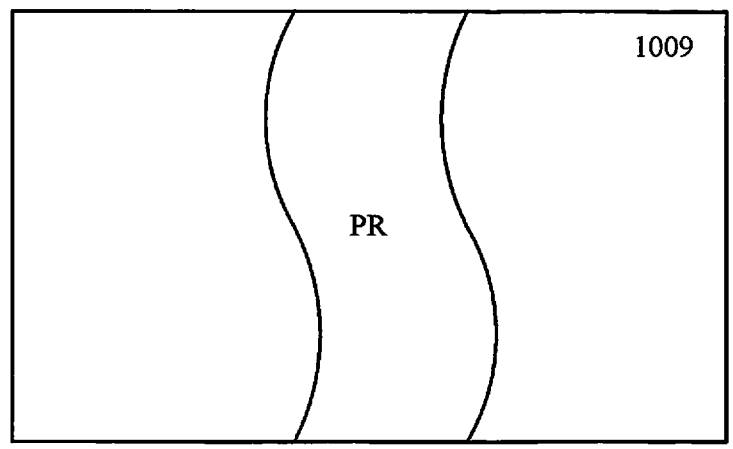
FIGS. 17-18 are schematic views showing some stages in a flow of manufacturing a semiconductor device according to a further embodiment of the present disclosure.
Figure 18:
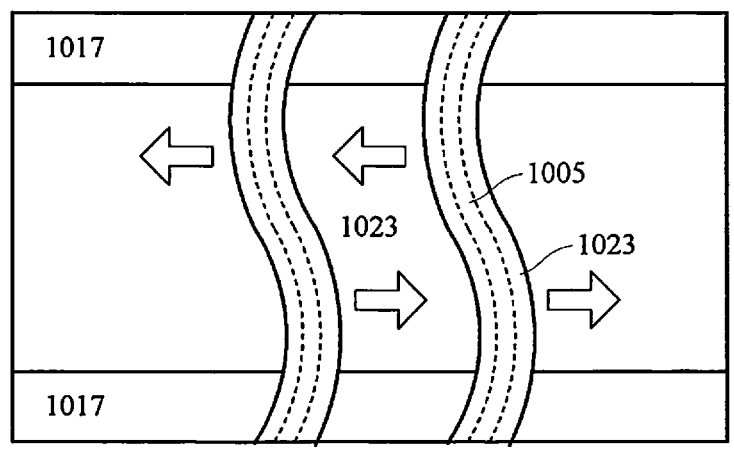

In the above example, the curved fin-shaped structure in substantially a "C" shape is formed. However, the present disclosure is not limited thereto, and various curved shapes such as an arc shape, an arcuate shape, a polynomial curve, or the like or a combination thereof may be formed. For example, as shown in FIG. 17, in the processes described above in connection with FIG. 1(*a*), the photoresist PR may be patterned into substantially a "S" shape rather than substantially a "C" shape. Other processes may be performed as described above. Thus, in the processes described above in connection with FIGS. 13(*a*)-13(*c*), the second semiconductor layer 1023 which also extends substantially in an "S" shape may be grown as shown in FIG. 18. The second semiconductor layer 1023 may also increase in length relative to the first semiconductor layer 1005 as described above. Thus, as shown by the arrows in FIG. 28, the center of the second semiconductor layer 1023 may be shifted relative to the original center of the first semiconductor layer 1005. This facilitates release of stresses in the growth process. More specifically, the center may be shifted towards a convex side of the curved shape (an upper half of the "S" shape is shifted to the left, and a lower half of the "S" shape is shifted to the right). After that, a gate stack intersecting the "S"-shaped fin 1023 may be formed as described above.

In the above embodiment, the FinFET is described as an example, but the present disclosure is not limited thereto. The technology of the present disclosure can be applied to various semiconductor devices, particularly semiconductor devices which desire to use materials of high mobility such as Ge, SiGe, III-V compound semiconductor materials, or the like, for example, various photoelectric devices such as photodiodes, Laser Diodes (LDs) or the like. For example, a pn junction may be formed by properly doping the semiconductor layer which is epitaxially grown on the seed layer to form a diode. Those skilled in the art are aware of various ways to manufacture various semiconductor devices based on second semiconductor layer.

The semiconductor devices according to the embodiments of the present disclosure are applicable to various electronic devices. For example, an Integrated Circuit (IC) may be formed by integrating a plurality of such semiconductor devices and other devices (for example, transistors in other forms or the like), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, or the like. Such an electronic device may comprise, for example, a smart phone, a tablet Personal Computer (PC), a Personal Digital Assistant (PDA), or the like.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

The invention claimed is:

1. A semiconductor device, comprising:
a substrate;
a first semiconductor layer which is fin-shaped and spaced apart from the substrate, wherein the first semiconductor layer extends in a curved form along a longitudinal extending direction thereof; and
a second semiconductor layer surrounding an entire circumference of at least a portion of the first semiconductor layer in the longitudinal extending direction to enclose at least the portion of the first semiconductor layer.

2. The semiconductor device according to claim 1, further comprising:
an isolation layer formed on the substrate, wherein the second semiconductor layer is at least partially exposed by the isolation layer, and an exposed portion of the second semiconductor layer extends in a fin shape; and
a gate stack formed on the isolation layer and intersecting the second semiconductor layer.

3. The semiconductor device according to claim 2, wherein the second semiconductor layer surrounding the entire circumference of at least the portion of the first semiconductor layer is located between the first semiconductor layer and the gate stack.

4. The semiconductor device according to claim 1, wherein the first semiconductor layer is substantially "C" shaped or "S" shaped.

5. The semiconductor device according to claim 1, wherein the first semiconductor layer comprises a first portion and a second portion along the longitudinal extending direction thereof, and the second semiconductor layer comprises a first portion surrounding an entire circumference of at least a fraction of the first portion of the first semiconductor layer in the longitudinal entending direction to enclose at least the fraction of the first portion of the first semiconductor layer and a second portion surrounding an entire circumference of at least a fraction of the second portion of the first semiconductor layer in the longitudinal extending direction to enclose at least the fraction of the second portion of the first semiconductor layer.

6. The semiconductor device according to claim 2, wherein the first semiconductor layer comprises a first portion and a second portion along the longitudinal extending direction thereof, the second semiconductor layer comprises a first portion surrounding an entire circumference of at least a fraction of the first portion of the first semiconductor layer in the longitudinal entending direction to enclose at least the fraction of the first portion of the first semiconductor layer and a second portion surrounding an entire circumference of at least a fraction of the second portion of the first semiconductor layer in the longitudinal entending direction to enclose at least the fraction of the second portion of the first semiconductor layer, and the gate stack comprises a first gate stack intersecting the first portion of the second semiconductor layer and a second gate stack intersecting the second portion of the second semiconductor layer.

7. The semiconductor device according to claim 5, further comprising: a dielectric layer extending in a direction intersecting the longitudinal extending direction of the first semiconductor layer, wherein the dielectric layer isolates the first portion of the first semiconductor layer from the second portion of the first semiconductor layer and isolates the first portion of the second semiconductor layer from the second portion of the second semiconductor layer.

8. The semiconductor device according to claim 1, further comprising:
a supporting portion through which the first semiconductor layer is physically connected to the substrate.

9. The semiconductor device according to claim 8, wherein the first semiconductor layer has a portion connected to the supporting portion, which has an extent, in the longitudinal extending direction of the first semiconductor layer, less than a length of the first semiconductor layer in the longitudinal extending direction.

10. The semiconductor device according to claim 8, wherein the supporting portion comprises a laterally extending portion extending along the surface of the substrate and a vertically extending portion extending in a direction substantially perpendicular to the surface of the substrate, wherein the vertically extending portion extends onto vertical sidewalls of the first semiconductor layer along the direction substantially perpendicular to the surface of the substrate.

11. The semiconductor device according to claim 10, wherein the vertically extending portion of the supporting portion extends on the vertical sidewalls on opposite sides of the first semiconductor layer to sandwich the first semiconductor layer.

12. The semiconductor device according to claim 8, wherein the supporting portion is positioned at opposite ends of the first semiconductor layer.

13. The semiconductor device according to claim 2, wherein the isolation layer fills a spacing between the first semiconductor layer and the substrate and a spacing between the second semiconductor layer and the substrate.

14. The semiconductor device according to claim 2, wherein the isolation layer has a portion under the second semiconductor layer, which is contiguous to the second semiconductor layer, and has remaining portions whose top surface is closer to the substrate than a bottom surface of the second semiconductor layer facing the substrate.

15. The semiconductor device according to claim 14, wherein the isolation layer has an undercut under the second semiconductor layer.

16. The semiconductor device according to claim 1, wherein the first semiconductor layer comprises Si, and the second semiconductor layer comprises Ge, SiGe, or a III-V compound semiconductor.

17. A method of manufacturing a semiconductor device, comprising:
forming, on a substrate, a first fin-shaped structure and a second fin-shaped structure extending in a curved form along a longitudinal extending direction thereof, wherein the first fin-shaped structure is stacked on the second fin-shaped structure;
forming a supporting portion for supporting the first fin-shaped structure on the first fin-shaped structure and the second fin-shaped structure;
at least partially removing a portion of the second fin-shaped structure which is close to the bottom of the first fin-shaped structure, so that the first fin-shaped structure is spaced apart from the second fin-shaped structure to form a first semiconductor layer; and
growing a second semiconductor layer with the first semiconductor layer as a seed layer.

18. The method according to claim 17, wherein the second fin-shaped structure comprises a sacrificial layer formed on the substrate, and the first fin-shaped structure comprises the first semiconductor layer stacked on the sacrificial layer.

19. The method according to claim 18, wherein forming a first fin-shaped structure and a second fin-shaped structure comprises: patterning the first semiconductor layer and the sacrificial layer in sequence into the fin-shaped structure.

20. The method according to claim 18, wherein at least partially removing a portion of the second fin-shaped structure which is close to the bottom of the first fin-shaped structure comprises: selectively removing the sacrificial layer.

21. The method according to claim 17, wherein the second semiconductor layer is grown by a selective growth method.

22. The method according to claim 17, further comprising:
forming an isolation layer on the substrate to at least partially expose the second semiconductor layer, wherein an exposed portion of the second semiconductor layer extends in a fin shape; and
forming a gate stack intersecting the second semiconductor layer on the isolation layer.

23. The method according to claim 22, wherein the isolation layer fills a spacing between the first semiconductor layer and the substrate and a spacing between the second semiconductor layer and the substrate.

24. The method according to claim 17, wherein the first semiconductor layer is formed in substantially a "C" shape or an "S" shape.

25. The method according to claim 17, wherein forming a supporting portion comprises:
forming a film material on the substrate with the first fin-shaped structure and the second fin-shaped structure formed thereon, and forming the supporting portion by patterning the film material to physically connect a surface of the first fin-shaped structure to a surface of the second fin-shaped structure.

26. The method according to claim 17, wherein forming a supporting portion comprises:
forming a film material on the substrate with the first fin-shaped structure and the second fin-shaped structure formed thereon, and forming the supporting portion by patterning the film material to extend from a surface of the substrate to a surface of the first fin-shaped structure to physically connect the first fin-shaped structure to the substrate.

27. The method according to claim 26, wherein forming a film material and patterning the film material comprises:
forming the film material to cover the first fin-shaped structure, the second fin-shaped structure and the surface of the substrate, and forming a mask to shield a portion of the film material, wherein the mask extends on the first fin-shaped structure and the second fin-shaped structure beyond an extent of the first fin-shaped structure and the second fin-shaped structure in a direction perpendicular to the longitudinal extending direction of the first fin-shaped structure and the second fin-shaped structure, and the mask covers only a fraction of a length of the first fin-shaped structure and the second fin-shaped structure in the longitudinal extending direction of the first fin-shaped structure and the second fin-shaped structure;
selectively removing a portion of the film material which is not shielded; and
removing the mask.

28. The method according to claim 27, wherein the method further comprises: after removing the mask,
selectively removing an upper end of the supporting portion to expose a top surface and a part of sidewalls of the first fin-shaped structure.

29. The method according to claim 27, wherein forming the mask comprises:
covering opposite ends of the first fin-shaped structure and the second fin-shaped structure with the mask.

30. The method according to claim 27, wherein forming the film material comprises:

depositing an oxide layer and a nitride layer in sequence in a substantially conformal way.

31. The method according to claim 22, where forming the insolation layer comprises:

forming an oxide layer on the substrate; and etching the oxide layer back, so that the isolation layer has a portion under the second semiconductor layer, which is contiguous to the second semiconductor layer, and has remaining portions whose top surface is closer to the substrate than a bottom surface of the second semiconductor layer facing the substrate.

32. The method according to claim 31, wherein when the oxide layer is etched back, an undercut is formed under the second semiconductor layer.

33. The method according to claim 22, further comprising:

forming, on the isolation layer, a dielectric layer extending in a direction intersecting the longitudinal extending direction of the first semiconductor layer, wherein the dielectric layer divides the first semiconductor layer into a first portion and a second portion, and divides the second semiconductor layer into a first portion and a second portion, wherein the gate stack comprises a first gate stack intersecting the first portion of the second semiconductor layer and a second gate stack intersecting the second portion of the second semiconductor layer.

34. An electronic device, comprising an integrated circuit comprising the semiconductor device according to claim 1.

35. The electronic device according to claim 34, further comprising a display operatively coupled to the integrated circuit and a wireless transceiver operatively coupled to the integrated circuit.

36. The semiconductor device according to claim 6, further comprising: a dielectric layer extending in a direction intersecting the longitudinal extending direction of the first semiconductor layer, wherein the dielectric layer isolates the first portion of the first semiconductor layer from the second portion of the first semiconductor layer and isolates the first portion of the second semiconductor layer from the second portion of the second semiconductor layer.

* * * * *